(12) United States Patent
Ko et al.

(10) Patent No.: US 7,363,460 B2
(45) Date of Patent: Apr. 22, 2008

(54) SEMICONDUCTOR MEMORY DEVICE HAVING TAG BLOCK FOR REDUCING INITIALIZATION TIME

(75) Inventors: Jae-Bum Ko, Ichon-shi (KR); Jin-Hong Ahn, Ichon-shi (KR); Sang-Hoon Hong, Ichon-shi (KR); Se-Jun Kim, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 311 days.

(21) Appl. No.: 10/749,900

(22) Filed: Dec. 30, 2003

(65) Prior Publication Data

US 2004/0221129 A1    Nov. 4, 2004

(30) Foreign Application Priority Data

Apr. 30, 2003   (KR) .................. 10-2003-0027653

(51) Int. Cl.
  *G06F 12/00*    (2006.01)
(52) U.S. Cl. ......................................... 711/202
(58) Field of Classification Search .................. None
  See application file for complete search history.

(56) References Cited

U.S. PATENT DOCUMENTS

| | | | |
|---|---|---|---|
| 4,914,577 A * | 4/1990 | Stewart et al. ............... | 711/207 |
| 5,165,029 A | 11/1992 | Sawai et al. | |
| 5,226,009 A | 7/1993 | Arimoto | |
| 5,469,555 A | 11/1995 | Ghosh et al. | |
| 5,497,473 A | 3/1996 | Miyoshi et al. | |
| 5,513,335 A | 4/1996 | McClure | |
| 5,584,003 A * | 12/1996 | Yamaguchi et al. ........... | 711/3 |
| 5,841,961 A | 11/1998 | Kozaru et al. | |
| 6,215,685 B1 | 4/2001 | Fung et al. | |
| 6,223,248 B1 | 4/2001 | Bosshart | |
| 6,286,075 B1 * | 9/2001 | Stracovsky et al. ............ | 711/5 |
| 6,408,345 B1 | 6/2002 | Fuoco et al. | |
| 6,412,044 B1 | 6/2002 | Kung | |
| 6,452,823 B1 | 9/2002 | Naji | |
| 6,557,080 B1 * | 4/2003 | Burger et al. ................ | 711/137 |

(Continued)

FOREIGN PATENT DOCUMENTS

JP        02-217944        8/1990

(Continued)

*Primary Examiner*—Gary Portka
*Assistant Examiner*—Craig E Walter
(74) *Attorney, Agent, or Firm*—Blakely, Sokoloff, Taylor & Zafman, LLP (57) ABSTRACT

A memory device includes a cell area having N+1 unit cell blocks. Each cell block includes M word lines. The N unit cell blocks are each corresponded to a logical cell block address. The one additional unit cell block is added for accessing data with high speed. A tag block receives a row address, senses the logical cell block address in the row address and outputs a physical cell block address based on the logical cell block address and the candidate information. The tag block includes: N+1 unit tag tables corresponding to the N+1 unit cell blocks. Each tag block has M number of registers. The M number of registers correspond to M number of word lines of the corresponding unit cell blocks. Each register stores one logical cell block address. The tag block also includes an initialization unit that initializes the N+1 unit tag tables.

3 Claims, 6 Drawing Sheets

U.S. PATENT DOCUMENTS

| | | | |
|---|---|---|---|
| 6,697,909 B1 * | 2/2004 | Wang et al. | 711/106 |
| 2004/0153793 A1 * | 8/2004 | Jarboe et al. | 714/27 |

FOREIGN PATENT DOCUMENTS

| | | |
|---|---|---|
| JP | 04-065739 | 3/1992 |
| JP | 05-012118 | 1/1993 |
| JP | 05-040691 | 2/1993 |
| JP | 05-073704 | 3/1993 |
| JP | 06-083704 | 3/1994 |
| JP | 07-049813 | 2/1995 |
| JP | 08-031195 | 2/1996 |
| JP | 08-212134 | 8/1996 |
| JP | 10-333982 | 12/1998 |
| JP | 11-283378 | 10/1999 |
| JP | 2001-188705 | 7/2001 |

\* cited by examiner

SEMICONDUCTOR MEMORY DEVICE HAVING TAG BLOCK FOR REDUCING INITIALIZATION TIME

FIELD OF INVENTION

The present invention relates to a semiconductor memory device; and, more particularly, to a tag block, for use in the semiconductor memory device, for reducing an initialization time at data access.

DESCRIPTION OF PRIOR ART

Generally, a semiconductor memory device is classified as a random access memory (RAM) and a read only memory (ROM).

The RAM includes a Dynamic RAM (DRAM) and a Static RAM (SRAM). One cell of the dynamic RAM has one transistor and one capacitor and that of the static RAM does four transistors and two load resistances. The DRAM is used more widespread than the SRAM because the DRAM is more efficient than SRAM in a chip integration and a manufacturing process.

Today, an operation speed of a central processing unit (CPU) is more dramatically advanced than that of the DRAM. As a result, many problems may arise because the operation speed of the memory device is slower than that of CPU. For overcoming these problems, several kinds of scheme in the memory device have been developed for a high speed data transmission.

Figure 1:
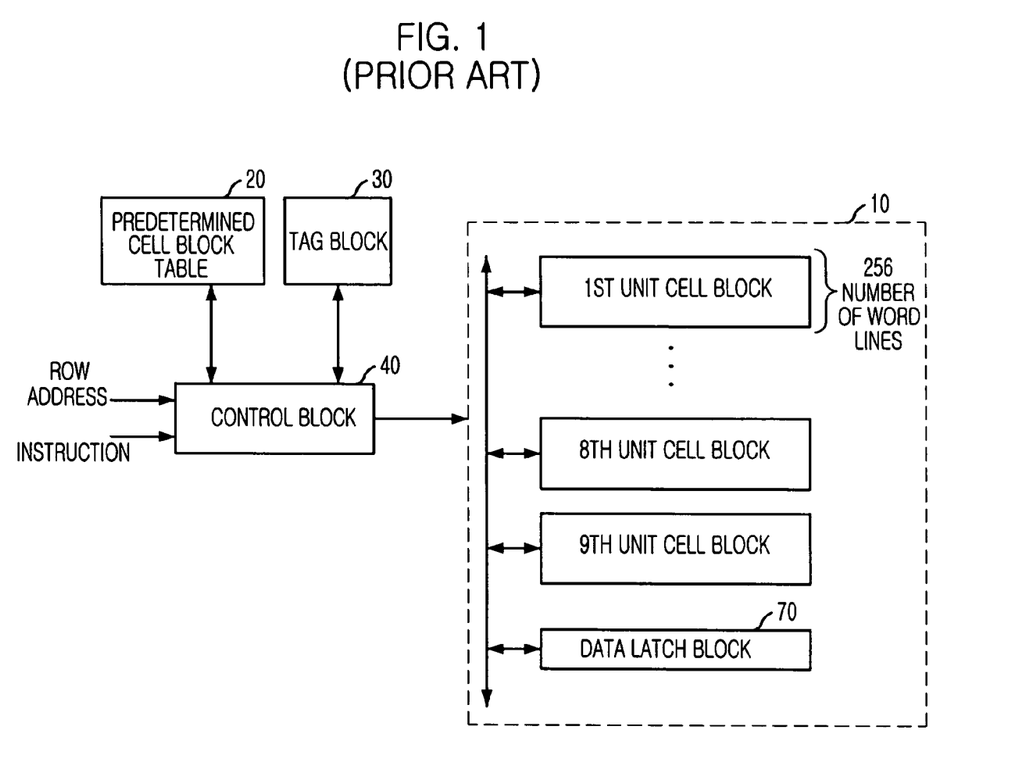
FIG. 1 is a block diagram showing a segment in a conventional semiconductor memory device.

FIG. 1 is a block diagram showing a bank in a conventional semiconductor memory device disclosed in a commonly owned copending application, U.S. Ser. No. 10/696,144, filed on Oct. 29, 2003, which issued as U.S. Pat. No. 6,937,535 entitled "SEMICONDUCTOR MEMORY DEVICE WITH REDUCED DATA ACCESS TIME", which is incorporated herein by reference.

As shown, the bank includes a cell area 10, a tag block 30, a predetermined cell block table 20 and a control block 40. The cell area 10 has N+1 number of unit cell blocks and a data latch block 70. Also, in each unit cell block, M number of word lines is coupled to a plurality of unit cells. The N and M are positive integers. Herein, N is 8 and M is 256. In addition, a size of memory device, i.e., a storage capability, is calculated with the exception of the additional unit cell block. Namely, a size of the bank is M(number of word lines)×N(number of unit cell blocks)×(number of bit lines). The predetermined cell block table 20 includes a plurality of registers for storing predetermined restore cell block address information. The predetermined restore cell block address information contains at least one predetermined restore cell block address among (8+1)×256 word line addresses. The tag block 30 generates a target restore cell block address corresponding to an access cell block address based on the predetermined restore cell block address information. The control block 40 controls the predetermined cell block table 20, the cell area 10 and the tag block 30 in order to support an cell block interleaving mode which can make the memory device operate on high speed without reduction of data access time when at least two data accesses are sequentially occurred in the same bank.

Herein, the cell block interleaving mode is defined as an operation that, during a current data in response to a current instruction is restored in the original cell block or in another cell block, a next data in response to a next instruction is simultaneously outputted from the same cell block.

In addition, a row address inputted to the control block 40 of the memory device corresponds to 8×256 word lines; and the other word lines, i.e., 256 word lines of additional cell block are assigned as predetermined word lines. However, the predetermined word lines are not fixed but changed during an operation of the memory device.

Figure 2:
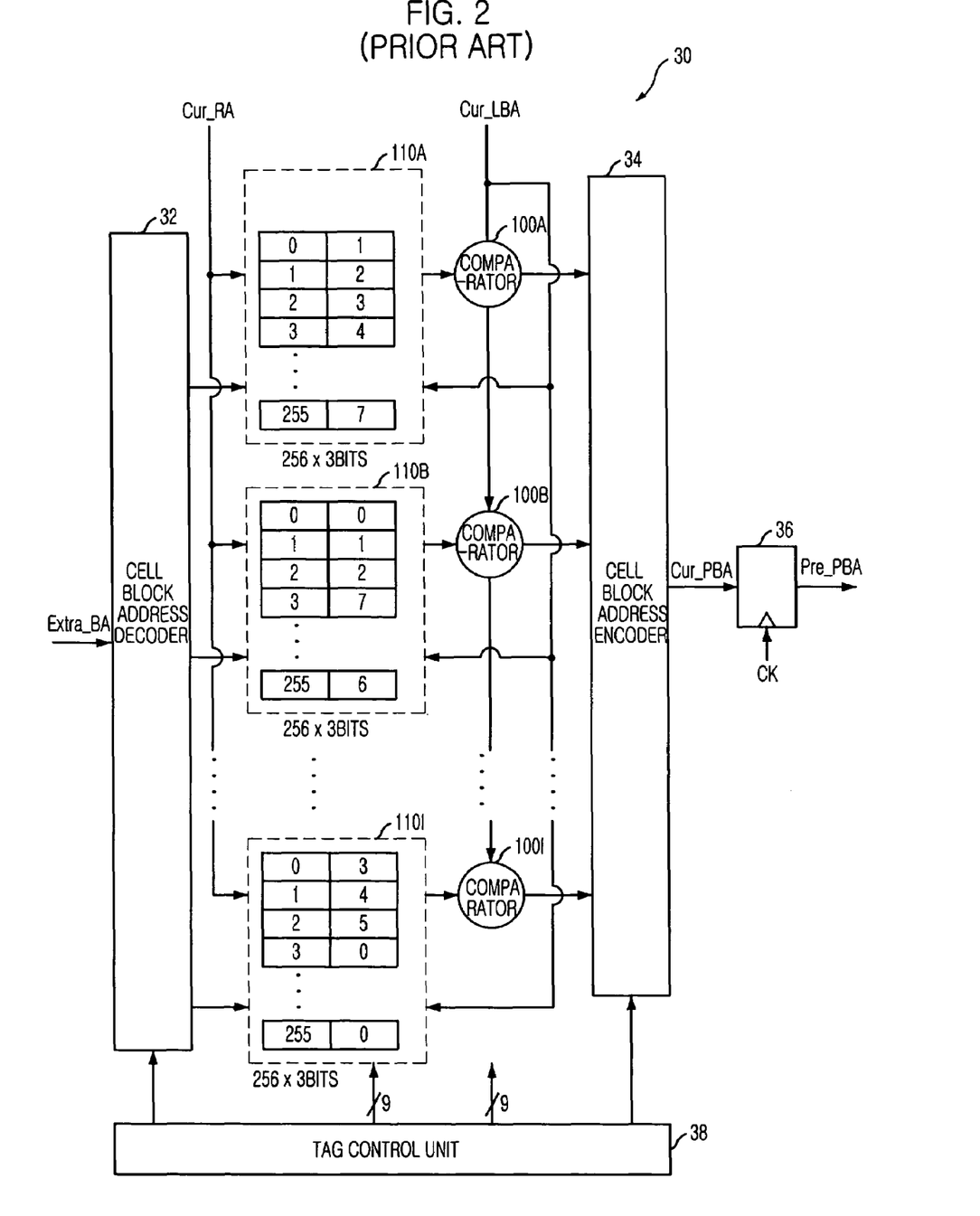
FIG. 2 is an exemplary block diagram depicting a tag block shown in FIG. 1.

FIG. 2 is a block diagram depicting the tag block 30 shown in FIG. 1.

As shown, the tag block 30 includes the 8+1 number of unit tag tables 110A to 110I, the 8+1 number of comparators 100A to 100I, a cell block address decoder 32, a cell block address encoder 34 and a tag control unit 38.

The cell block address decoder 32 receives a available restore cell block address Extra_BA outputted from the predetermined cell block table 20 and selects one among unit tag tables 110A to 110I in response to the available restore cell block address Extra_BA. Then, the comparator, e.g., 100A compares an address of converting a current row address Cur_RA based on the selected unit tag table with a logical cell block address Cur_LBA. And last, the cell block address encoder 1834 outputs a current restore physical cell block address Cur_PBA which is encoded in response to a result of comparison. Herein, each of the unit tag tables 110A to 110I stores a restore cell block address information corresponding to N×256 word lines of unit cell blocks.

The tag block 30 further includes a delay unit 36 for delaying the current restore physical cell block Cur_PBA by one clock period to access a restore cell block.

Herein, each of unit tag tables 110A to 110I has 256 registers, and one register LBA consists of three bits because the number of the logical cell block addresses is 8. For instance, the first unit tag/table 110A stores information what logical cell block is corresponded with each 256 numbers of the word lines included in the first unit cell block, and the second unit tag table 110B stores information what logical cell block is corresponded with each of 256 numbers of the word lines included in the second unit cell block.

In addition, in each unit tag table 110A to 110I, the first register 0 stores the logical cell block address in response to the word line 'WL0' of each unit cell block, the second register 1 stores the logical cell block address in response to the word line 'WL1' of each unit cell block, and 256 th register 255 stores the logical cell block address in response to the word line 'WL255' of each unit cell block.

For example, referring to the first unit tag table 110A, first register 0 stores '1' and $255^{th}$ register 255 stores '7'. That is, in the first unit cell block, first word line WL0 corresponds with first word line WL0 of the second logical unit cell block and $255^{th}$ word line WL255 corresponds with $255^{th}$ word line WL255 of the eighth logical unit cell block.

Figure 3:
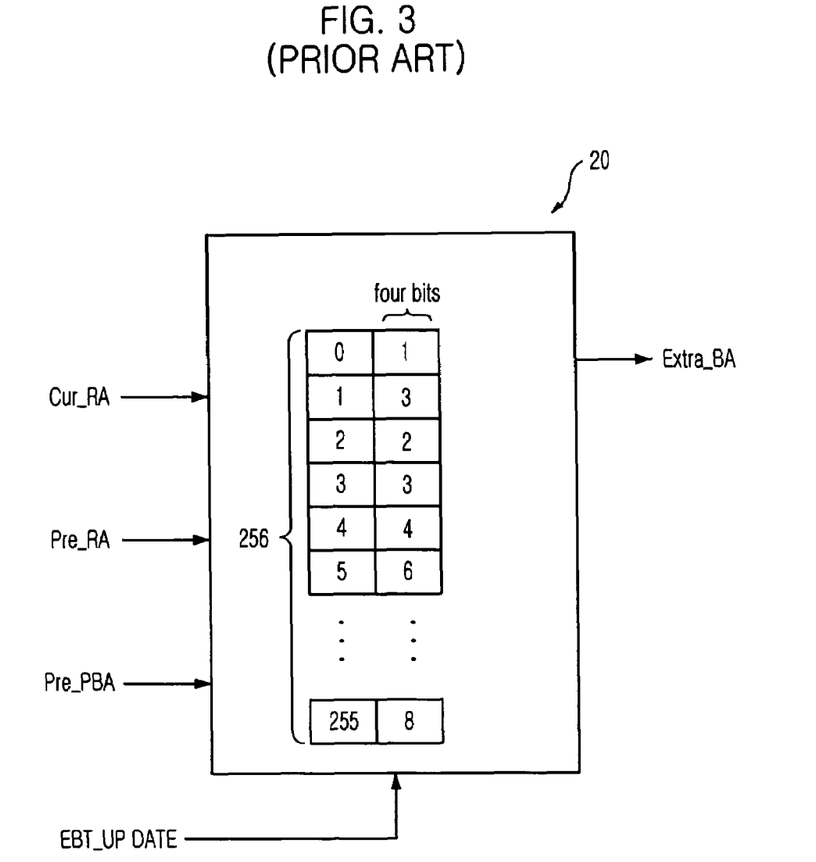
FIG. 3 is an exemplary block diagram describing a predetermined cell block table shown in FIG. 1.

FIG. 3 a block diagram describing the predetermined cell block table 20 shown in FIG. 1.

As shown, the predetermined cell block table 20 includes 256 registers, each having the predetermined restore cell block address information. The predetermined restore cell block address information contains a predetermined restore cell block address. The predetermined restore cell block address consists of 4 bits because the number of physical unit cell blocks is nine. The predetermined restore cell block address information represents a target cell block to be restored, corresponding to an accessed word line of unit cell block.

For instance, referring to the predetermined restore cell block address stored in each register, a first register 0 stores '1' and a second register 1 stores '3'. That is, a predetermined word line of a first word line WL0 is a first word line WL0 of the second unit cell block and a predetermined word line of a second word line WL1 is a second word line WL0 of the forth unit cell block. Herein, during the operation of the memory device, 256 registers of the predetermined cell block table are continuously updated.

The predetermined cell block table 20 receives a current row address Cur_RA, a previous row address Pre_RA and a previous restore physical cell block address Pre_PBA. Also, the predetermined cell block table 20 is updated by an updating signal EBT_UP DATE. The predetermined cell block table 20 outputs an available restore cell block address Extra_BA to the tag block 30.

Figure 4:
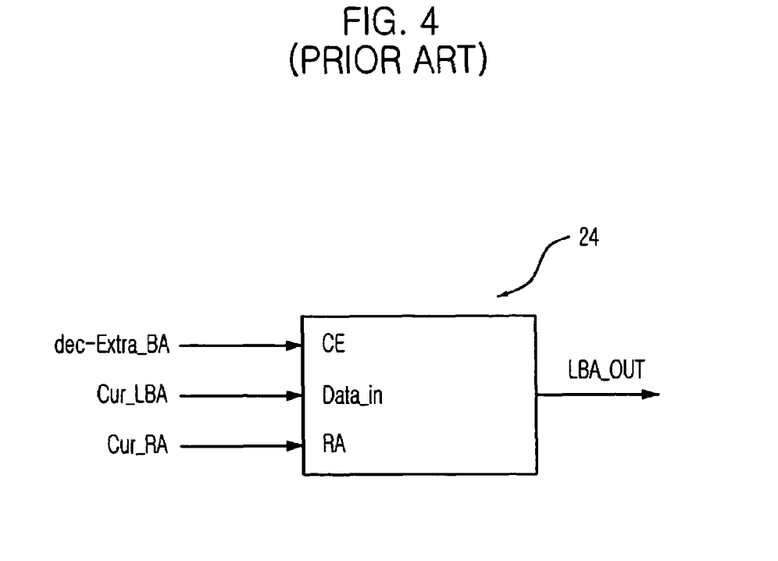
FIG. 4 is a block diagram showing a block diagram showing a unit tag table shown in FIG. 2.

FIG. 4 is a block diagram showing the unit tag table, e.g., 110A shown in FIG. 2.

As shown, the unit tag table 110A is enabled by a decoded signal dec-Extra_BA outputted from the cell block address decoder 32 and receives the logical cell block address Cur_LBA and the local address Cur_RA. The local address Cur_RA is a kind of address for selecting one among 256 number of word lines included in one unit cell block.

The unit tag table 110A includes 256 register which can store 3-bit data. Data stored in a register selected by the local address Cur_RA is outputted as a selected logical cell block address LBA_OUT. Also, at updating a register, the register selected by the local address Cur_RA is updated into the logical cell block address Cur_LBA.

Figure 5:
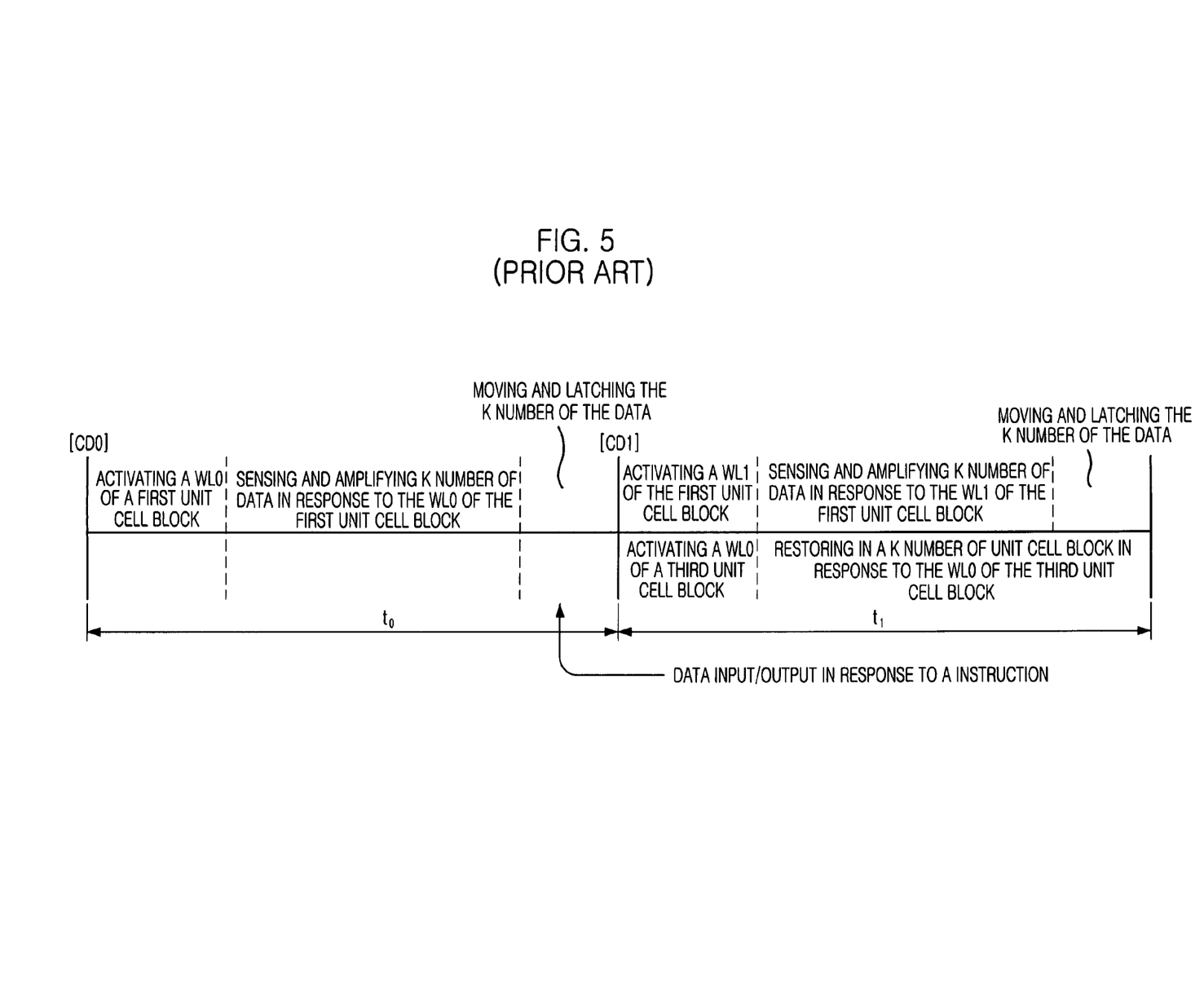
FIG. 5 is a timing diagram describing the operation of the memory device described in FIG. 1.

FIG. 5 is a timing diagram describing operation of the memory device shown in FIG. 1; and, especially, describes the intra cell block interleaving mode when a first and a second data are sequentially accessed in the same unit cell block among 8+1 numbers of the unit cell blocks shown in FIG. 1.

Hereinafter, referring to FIGS. 1 to 5, there is described the operation of the conventional memory device shown in FIG. 1.

The additional unit cell block is used for restoring the first data when the second data are sequentially accessed in the same unit cell block. As shown in FIG. 5, the first data is stored in unit cells coupled to a first word line WL0, and the second data is stored in unit cells coupled to a second word line WL1 of the same unit cell block.

First, at a first timing period t0, the first word line WL0 of, e.g., first unit cell block is activated in response to a first instruction CD0; and, then, first data in response to the first word line WL0 is sensed and amplified. The amplified first data moves to the data latch block 70.

If the first instruction CD0 is a read instruction, data in response to the first instruction CD0 among K number of data latched in the data latch block 70 is outputted; otherwise, i.e., if the first instruction CD0 is a write instruction, data in response to the first instruction CD0 among K number of data latched in the data latch block 70 is overwritten by an inputted data of external circuit.

At a second timing period t1, first, the second word line WL1 of, e.g., first unit cell block is activated in response to a second instruction CD1; and, at the same time, the first word line WL0 of, e.g., third unit cell block is activated.

Then, the second data in response to the second word line WL1 is sensed and amplified; and, at the same time, the first data is restored into unit cells in response to the first word line WL0 of the third unit cell block.

As described above, the data access time of the conventional memory device can be actually precluded the data restoration time, because the second data can be sensed and amplified by the next instruction during the first data in response to the present instruction is restored. Thus, the data access time can be effectively reduced to thereby obtain a high speed operation of the memory device. In addition, in the conventional memory device, the data restoration operation can be simplified by simply changing only the cell block address of the data.

In the other hand, hereinafter, there is described the inter cell block interleaving mode when a third and a forth data are sequentially accessed in each different unit cell block among 8+1 numbers of the unit cell blocks (not shown).

Contrary to the intra cell block interleaving mode, the third data outputted from a unit cell block is stored in the original unit cell block at the same timing of outputting the forth data from another unit cell block.

In this case, the data access time of the conventional memory device can be actually precluded the data restoration time, because the forth data can be sensed and amplified by the next instruction during the third data in response to the present instruction is restored.

In the conventional memory device, the inputted cell block address is considered as the logical unit cell block address, i.e., address for selecting one among 8 unit cell blocks. But the conventional memory device actually includes 8+1 unit cell blocks, so the inputted cell block address is converted into a physical unit cell block address. This process is carried out by the control block 40.

Herein, each unit tag table included in the tag block 30 of the conventional memory device shown in FIG. 1 should be initialized at an initialization operation. As shown in FIG. 2, each unit tag table should be selected in order for being initialized. Then, the local address Cur_RA is inputted; and the logical cell block address storing initial value is inputted. For instance, the local address Cur_RA is inputted in order from '0' to '255' and the logical cell block address is inputted as '0'. After initializing the first unit tag table 110A, the second unit tag table 110B is initialized by the same manner.

Therefore, for initializing all unit tag table, the initialization operation is performed 256×9 times. For operating the memory device in high speed, the initialization operation of the unit tag block should be simplified and carried out during short time.

SUMMARY OF INVENTION

It is, therefore, an object of the present invention to provide a method and an apparatus of a memory device for accessing data on high speed so that the data restoration time does not affect seriously the data access time.

In accordance with an aspect of the present invention, there is provided a semiconductor memory device including a cell area having N+1 number of unit cell blocks, each including M number of word lines; a predetermined cell block table for storing a candidate information representing at least more than one candidate word line among the M number of the word lines to be stored data; and a tag block for receiving a row address, sensing a logical cell block address in the row address and outputting a physical cell block address based on the logical cell block address and the candidate information, wherein the tag block includes: a N+1 number of unit tag tables, each having M number of registers and storing a store information that the registers corresponds to M number of word lines, each register storing each the physical unit cell block address in response to the logical cell block among unit cell block addresses having a word line in response to the candidate information; and an initialization unit for initializing the N+1 number of unit tag tables.

In accordance with another aspect of the present invention, there is provided a method for controlling a tag block for assigning a physical unit cell address based on a logical unit cell block, including the steps of: a) initializing the tag block in a semiconductor memory device; and b) performing a normal operation of the semiconductor memory device by using the tag block.

BRIEF DESCRIPTION OF DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a semiconductor memory device having an advanced data strobe circuit according to the present invention will be described in detail referring to the accompanying drawings.

Figure 6:
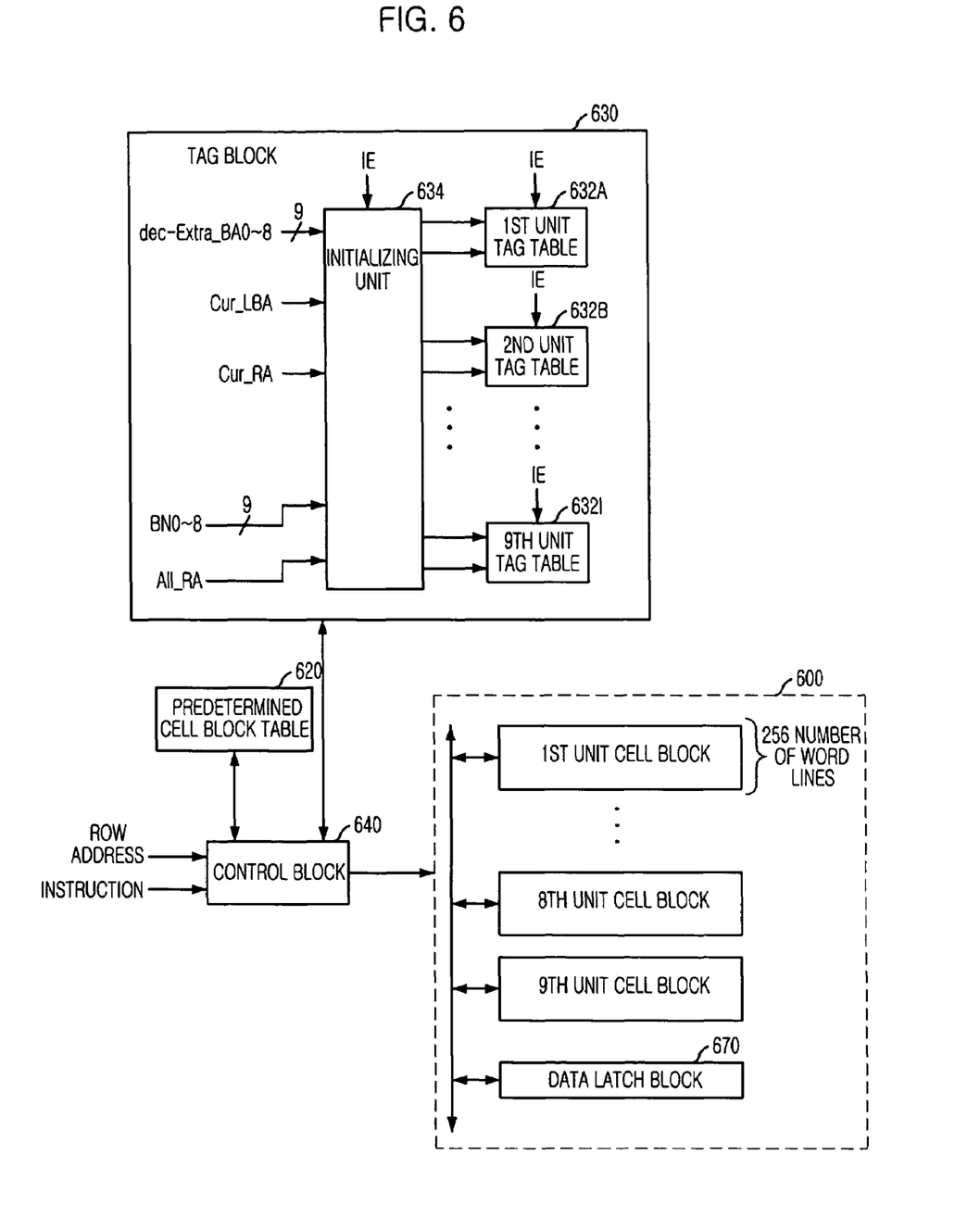
FIG. 6 is a block diagram showing a segment in a semiconductor memory device in accordance with the present invention.

FIG. 6 is a block diagram showing a bank in a semiconductor memory device in accordance with the present invention.

As shown, the bank includes a cell area 600, a predetermined cell block table 620, a tag block 630 and a control unit 640. The cell area 600 has 8+1 number of unit cell blocks, each including 256 number of word lines for responding to an inputted row address. A row address is inputted in response to eight unit cell blocks. Herein, the cell area 600 further includes additional unit cell block. The predetermined cell block table 620 is used for storing information wherein at least more than one word line among the (8+1)× 256 number of the word lines is assigned as a predetermined restorable word line by using the information. The tag block 630 receives the row address, senses a logical cell block address designated for accessing one of N number of unit cell blocks, converts the logical cell block address into a physical cell block address designated for accessing one of the N+1 number of unit cell blocks and outputs the physical cell block address. The control unit 640 is used for controlling the tag block 630 and the predetermined cell block table 620 for activating one word line of a unit cell block selected by the physical cell block address.

Herein, the tag block 630 includes an N+1 number of unit tag tables 632A to 632I for storing information that 256 number of word lines included in each of 8+1 number of unit cell blocks correspond to the logical unit cell block; and an initialization unit 634 for initializing the 8+1 number of unit tag tables.

Figure 7:
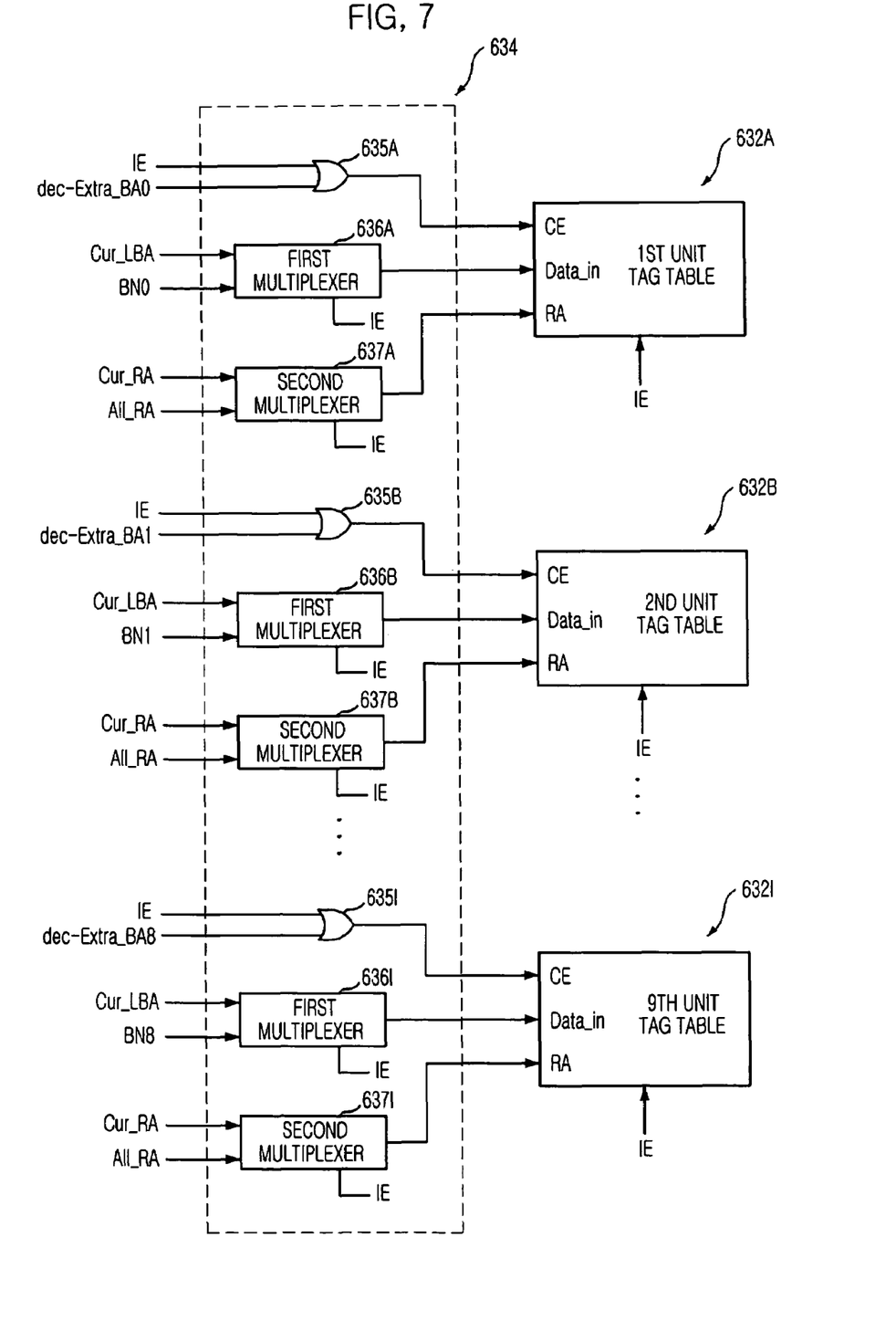
FIG. 7 is a detailed block diagram depicting an initialization unit shown in FIG. 6.

FIG. 7 is a detailed block diagram depicting an initialization unit shown in FIG. 6.

As shown, the initialization unit 634 includes a plurality of logical OR gates 635A to 635I, a plurality of first multiplexers 636A to 636I and a plurality of second multiplexers 637A to 637I.

The plurality of logical OR gates 635A to 635I are used for respectively receiving an initialization selection signal IE to nullify all of the 8+1 number of unit tag tables and each of tag table selection signals dec-Ectra_BA0 to dec-Ectra_BA8 to select one of the 8+1 number of unit tag tables and respectively outputting each of initialization activating signals to each of the N+1 number of unit tag tables.

The plurality of first multiplexers 636A to 636I are controlled by the initialization selection signal IE for selectively outputting one between the input logical cell block address Cur_LBA and each of initialization signals BN0 to BN8 to initialize each of the N+1 number of unit tag tables to each of the N+1 number of unit tag tables.

The plurality of second multiplexers 637A to 637I are controlled by the initialization selection signal IE for selectively outputting one between a local address Cur_RA to select M number of word lines included in each of the N+1 number of unit cell blocks and an initialization address All_RA to select all register included in one of the unit tag table.

Hereinafter, referring to FIGS. 6 and 7, an initializing operation of the semiconductor memory device in accordance with the present invention is described in detail.

If an initialization operation is started, nine(8+1) unit tag tables 632A to 632I included in the tag block 630 are simultaneously selected by inputting the initialization activating signals outputted from nine(8+1) logical OR gates after the initialization selection signal IE is inputted to the nine(8+1) logical OR gates. Also, the plurality of first multiplexers 636A to 636I respectively output each of the initialization signals BN0 to BN8 to each of the nine unit tag tables 632A to 632I.

After the initialization operation, in the nine unit tag tables 632A to 632I, eight unit tag tables store first to eighth logical cell block addresses and the extra one is a predetermined cell block for restoring data.

At the initialization operation, eight unit tag tables among the nine unit tag tables 632A to 632I respectively store each different logical cell block address. For instance, the first unit tag table 632A stores the first logical cell block address and the second unit tag table 632B stores the second logical cell block address.

In detail, the unit tag table has 256 number of registers, each having 3 bits, because the 256 registers included in the unit tag table respectively stores information that each of 256 word lines of the unit cell block corresponds to which logical cell block. Namely, at the initialization operation, 256 registers of the first unit tag table 632A individually store '0' which means the first logical unit cell block; and 256 registers of the second unit tag table 632B individually store '1' which means the second logical unit cell block.

For storing each initialized logical cell block address in 256 registers of the unit tag table, each of the plurality of second multiplexers 637A to 637I outputs the initialization address All_RA to each of unit tag tables 632A to 632I. If the unit tag table receives the initialization address All_RA, 256 registers store inputted initialization signal, e.g., BN0.

Thus, after the initialization operation, the first to the eighth unit tag tables 632A to 632H respectively have 256 registers, each storing '0'to '7'. And, 256 registers of the ninth unit tag table 632I do not have to store any particular initialization value, e.g, '0'or '1', because the 256 registers of ninth unit tag tables correspond to the predetermined cell block.

Therefore, the present invention can dramatically reduces initializing time for initializing the tag block by performing the initialization operation on all unit tag tables of the tag block at once.

In addition, an operation speed of the semiconductor memory device having the tag block in accordance with the present invention is advanced by reducing the initializing time for initializing the tag block.

While the present invention has been described with respect to the particular embodiments, it will be apparent to those skilled in the art that various changes and modification may be made without departing from the spirit and scope of the invention as defined in the following claims.

What is claim is:

1. A semiconductor memory device, comprising:
   a cell area having N+1 number of unit cell blocks, each including M number of word lines wherein the N number of unit cell blocks are each corresponded to a logical cell block address and one unit cell block is added for accessing data with high speed;
   a predetermined cell block table for storing candidate information representing at least more than one candidate word line among the M * (N+1) number of the word lines; and
   a tag block for receiving a row address, sensing the logical cell block address in an inputted row address and outputting a physical cell block address based on the logical cell block address and the candidate information,
   wherein the tag block includes:
   N+1 number of unit tag tables corresponding to the N+1 number of unit cell blocks, each having M number of registers, the M number of registers corresponding to M number of word lines of corresponding unit cell blocks, each register storing one logical cell block address; and
   an initialization unit for initializing the N+1 number of unit tag tables.

2. The semiconductor memory device as recited in claim 1, further comprising:
   a control means for controlling the tag block and the predetermined cell block table for activating one word line of a unit cell block selected by the physical cell block address.

3. The semiconductor memory device as recited in claim 1, wherein the initialization unit includes:
   a plurality of logical OR gates respectively corresponding the N+1 number of unit cell blocks for respectively receiving an initialization enable signal to enable the N+1 number of unit tag tables and a tag table selection signal to select one of the N+1 number of unit tag tables and respectively outputting a corresponding initialization activating signal to the corresponding unit tag tables;
   a plurality of first multiplexers controlled by the initialization enable signal and respectively corresponding to the N+1 number of unit cell blocks for outputting either the logical cell block address or an initialization signal initializing corresponding unit tag tables of the N+1 number of unit tag tables; and
   a plurality of second multiplexers controlled by the initialization enable signal and respectively corresponding the N+1number of unit cell blocks for selectively outputting one of plural local addresses to select one of M number of word lines of corresponding unit cell blocks and an initialization address to select all registers included in the corresponding unit tag table.

* * * * *